(12) United States Patent
Roberts et al.

(10) Patent No.: US 6,232,041 B1
(45) Date of Patent: May 15, 2001

(54) HEAT TRANSFER

(75) Inventors: Chris Roberts, Pickerington; James Glassburn, Delaware, both of OH (US)

(73) Assignee: Impulse Wear Inc., Blacklick, OH (US)

(*) Notice: Subject to any disclaimer, the term of this patent is extended or adjusted under 35 U.S.C. 154(b) by 0 days.

(21) Appl. No.: 09/413,519

(22) Filed: Oct. 6, 1999

Related U.S. Application Data

(60) Provisional application No. 60/103,274, filed on Oct. 6, 1998.

(51) Int. Cl.$^7$ ........................................... G03F 7/12
(52) U.S. Cl. ........................... 430/308; 430/301; 101/115
(58) Field of Search .................................. 430/308, 301; 101/115

(56) References Cited

U.S. PATENT DOCUMENTS

| | | | | |
|---|---|---|---|---|
| 4,789,621 | * | 12/1988 | Knoth | 430/283 |
| 5,136,938 | * | 8/1992 | Pellegrina | 101/115 |
| 5,372,506 | * | 12/1994 | Hambright | 434/84 |
| 5,590,600 | * | 1/1997 | Hale et al. | 101/488 |
| 5,908,000 | * | 6/1999 | Spychalla et al. | 101/487 |
| 6,087,061 | * | 7/2000 | Hare et al. | 430/256 |

\* cited by examiner

*Primary Examiner*—Hoa Van Le
*Assistant Examiner*—Barbara Gilmore
(74) *Attorney, Agent, or Firm*—Porter, Wright, Morris & Arthur LLP

(57) ABSTRACT

A method of making a heat transfer from an image for application to a T-shirt or other piece of cloth is disclosed. An image is scanned to create a computer image represented by a computer readable image file. The image is separated into a plurality of colors using a computer to create a separated image. A plurality of plates is created from the separated image corresponding to each of the colors. The plates are printed on film to create a plurality of color separation films corresponding to one of the plurality of colors. Mesh screens are treated with a photoemulsion. The color separation films are then placed on the mesh screens and light is applied to the mesh screens A portion of the photoemulsion hardens in the light and a second portion of the photemulsion covered by the printed matter on the color separation films remains soft. The mesh screens are washed to remove the second portion of the photoemulsion. Ink is applied to a piece of transfer paper through the mesh screens.

20 Claims, 15 Drawing Sheets

HEAT TRANSFER

This application claims priority from Provisional Application Serial No. 60/103,274, filed Oct. 6, 1998.

BACKGROUND OF THE INVENTION

1. Field of Invention

This invention pertains to the art of methods and apparatuses for reproducing fine art on heat transfers that are applied to clothing and other items, and more specifically to methods and apparatuses for producing heat transfers having improved qualities, such as photographic quality images with lifelike eyes and a three-dimensional effect.

2. Description of the Related Art

Conventional transfer technologies typically use one of three processes. The first process is the spot color or block color process, in which each actual color in the artwork is printed. This process generally is not cost-effective due to the number of ink colors required and has a number of disadvantages. Resolution is low, only a limited number of colors are available, and there is a limited ability to achieve gradations in color. Also, half-tones cannot be used, but rather only solid blocks of color. This process is suitable only for simple designs.

The second process is the clear carrier or Trans-Art process. The clear carrier process uses a clear carrier layer and translucent inks. The inks used with the clear carrier process are the four-color or CMYK ink palettes. Colored inks are applied to the carrier layer in the following order: 1. red, 2. black, 3. blue, and 4. yellow. A white highlight layer is then applied.

The third process creates opaque transfers using halftones. These opaque transfers have low resolution, low color values, and poor color reproduction.

Recent direct printing technologies include use of unlimited color pallettes. Software is available for use by direct printers that allows printing of high-resolution, full-color, photographic images. The software scans in an image, selects ink colors from a library, and prepares color separations that show which portions of a screen will have a particular color applied to them and which will not.

Direct printers generally apply a solid white base layer first, then up to eight translucent colors, generally in the following order: red, blue, purple, gold, green, turquoise, gray, brown, white (highlight), and Black. Commercial software is available to assist direct printers in obtaining color separations and color densities from scanned-in artwork.

Direct printing technology is not suitable for printing transfers. Transfers are printed in reverse color order so that the correct image appears on the substrate to which to transfer is applied. Transfers also must be printed so the desired arrangement of colors appears at the ink split rather than the upper surface of the transfer sheet.

The present invention contemplates a new and improved method for making heat transfers with opaque inks which is simple in design, effective in use, and overcomes the foregoing difficulties and others while providing better and more advantageous overall results.

SUMMARY OF THE INVENTION

In accordance with the present invention, a new and improved method for reproducing fine art on heat transfers that are applied to clothing and other items is provided which creates high quality transfers.

According to one aspect of the present invention, a method of making a heat transfer from an image for application to a T-shirt or other piece of cloth is disclosed. The method includes the steps of scanning the image to create a computer image represented by a computer readable image file, separating the computer image into a plurality of colors using a computer to create a separated image, creating a plurality of plates from the separated image, each of the plurality of plates corresponding to one of the plurality of colors, printing each of the plurality of plates on film to create a plurality of color separation films, the color separation films having printed matter corresponding to one of the plurality of colors; treating a plurality of mesh screens with a photoemulsion; placing the plurality of color separation films on the plurality of mesh screens; applying light to the mesh screens, a portion of the photoemulsion hardening in the light and a second portion of the photemulsion covered by the printed matter on the color separation films remaining soft; washing the plurality of mesh screens to remove the second portion of the photoemulsion; and applying ink to a piece of transfer paper through the plurality of mesh screens.

One advantage of the present invention is that the bright, opaque transfers are created that may be applied to dark color shirts.

Another advantage of the present invention is that the images created on the heat transfers look nearly identical to the original artwork.

Yet another advantage of the present invention is that a wide range of colors may be achieved using a reasonable (cost-effective) number of ink color layers.

Still other benefits and advantages of the invention will become apparent to those skilled in the art to which it pertains upon a reading and understanding of the following detailed specification.

BRIEF DESCRIPTION OF THE DRAWINGS

The invention may take physical form in certain parts and arrangement of parts, a preferred embodiment of which will be described in detail in this specification and illustrated in the accompanying drawings that form a part of this document.

DESCRIPTION OF THE PREFERRED EMBODIMENT

Figure 1:
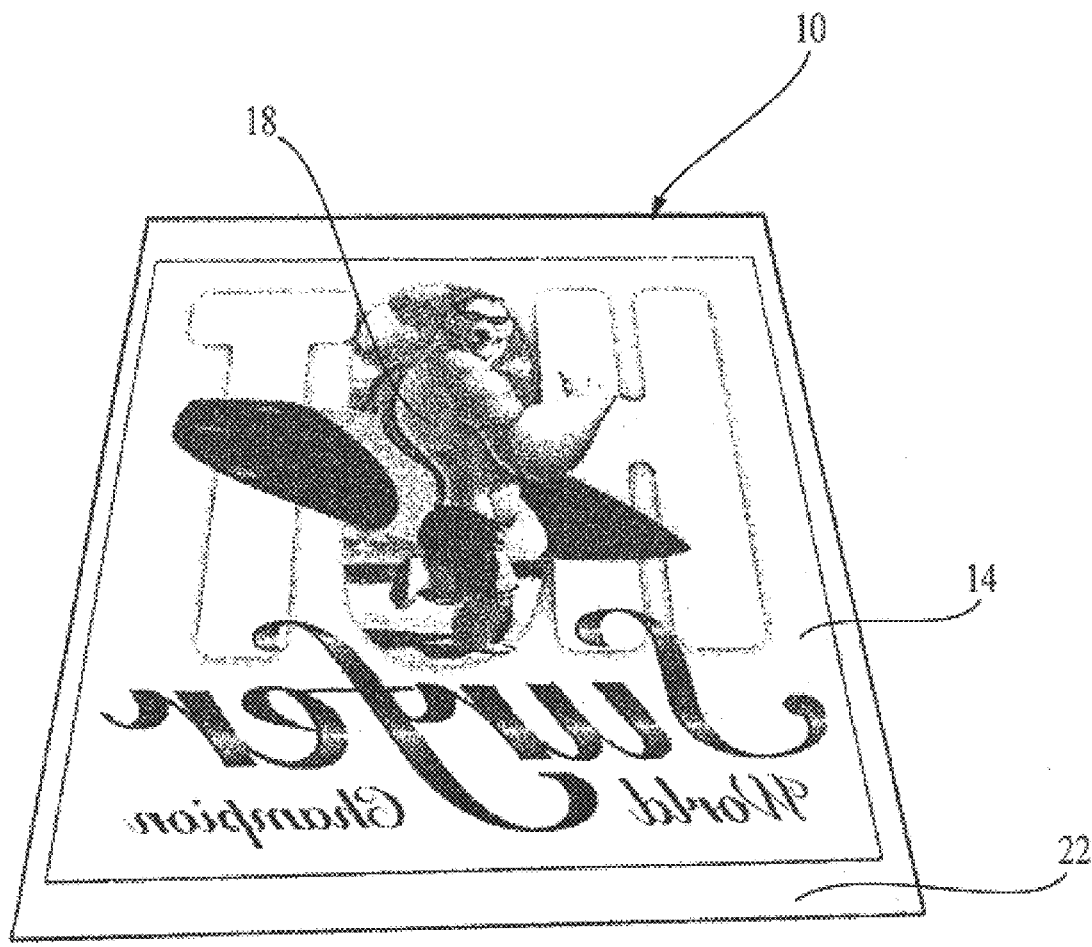
FIG. 1 shows a perspective view of a heat transfer.

The invention compresses a heat transfer and method of making a heat transfer. The transfers are made in two general steps, a pre-press step in which screens are prepared for printing the transfers and a printing step in which ink is applied to transfer paper through the screens.

Referring now to the drawings, which the showings are to illustrate a preferred embodiment of the invention only and not to limit the same, FIGS. 1–5 concern the application of opaque (i.e., not translucent) plastisol inks for reproducing fine art on heat transfers 10.

A heat transfer 10 includes an image 14 created with ink 18 and applied to heat transfer paper 22. When a heat source is applied to a heat transfer 10, the ink 18 is transferred from the heat transfer paper 22 to a piece of fabric (not shown) on which the heat transfer 10 is placed, such as a T-shirt.

The first step of the process for producing the improved heat transfer 10 is the selection of the image 14.

After the image is selected, the image 14 is then scanned into a computer. In the preferred embodiment, the image 14 is scanned as a RGB.tiff file, which differs from other printing methods. The scanned image is then preferably color corrected and digitally altered, or "cleaned up," to match the original image 14. Throughout the entire process, the image 14 is maintained in the RGB format. When the altered, scanned image is closely matched to the original image, the next step of the process is the separation of colors.

Figure 2:
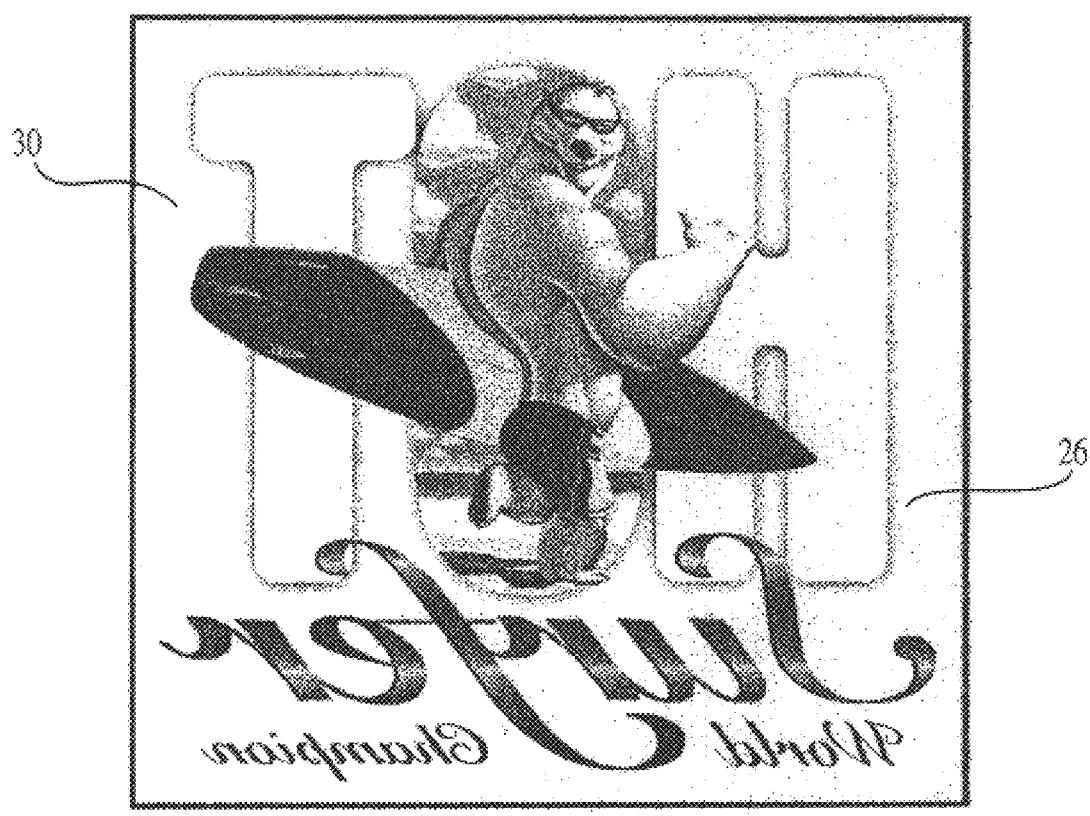
FIG. 2 shows a color separation plate.
Figure 6:
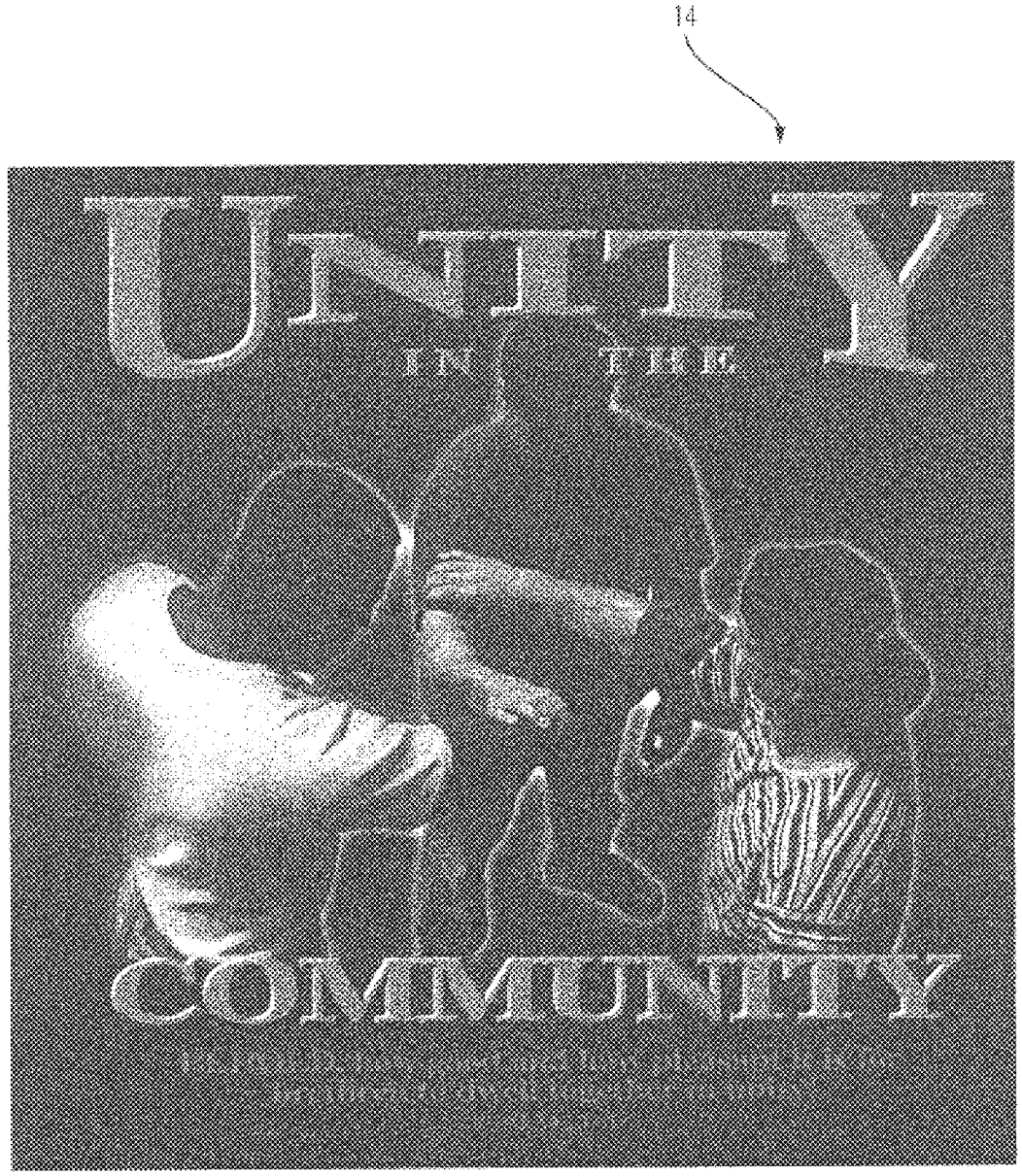
FIGS. 6 shows an image.
Figure 7:
FIGS. 7–15 show color separations according to the present invention of the image of FIG. 6.
Figure 8:
Figure 9:
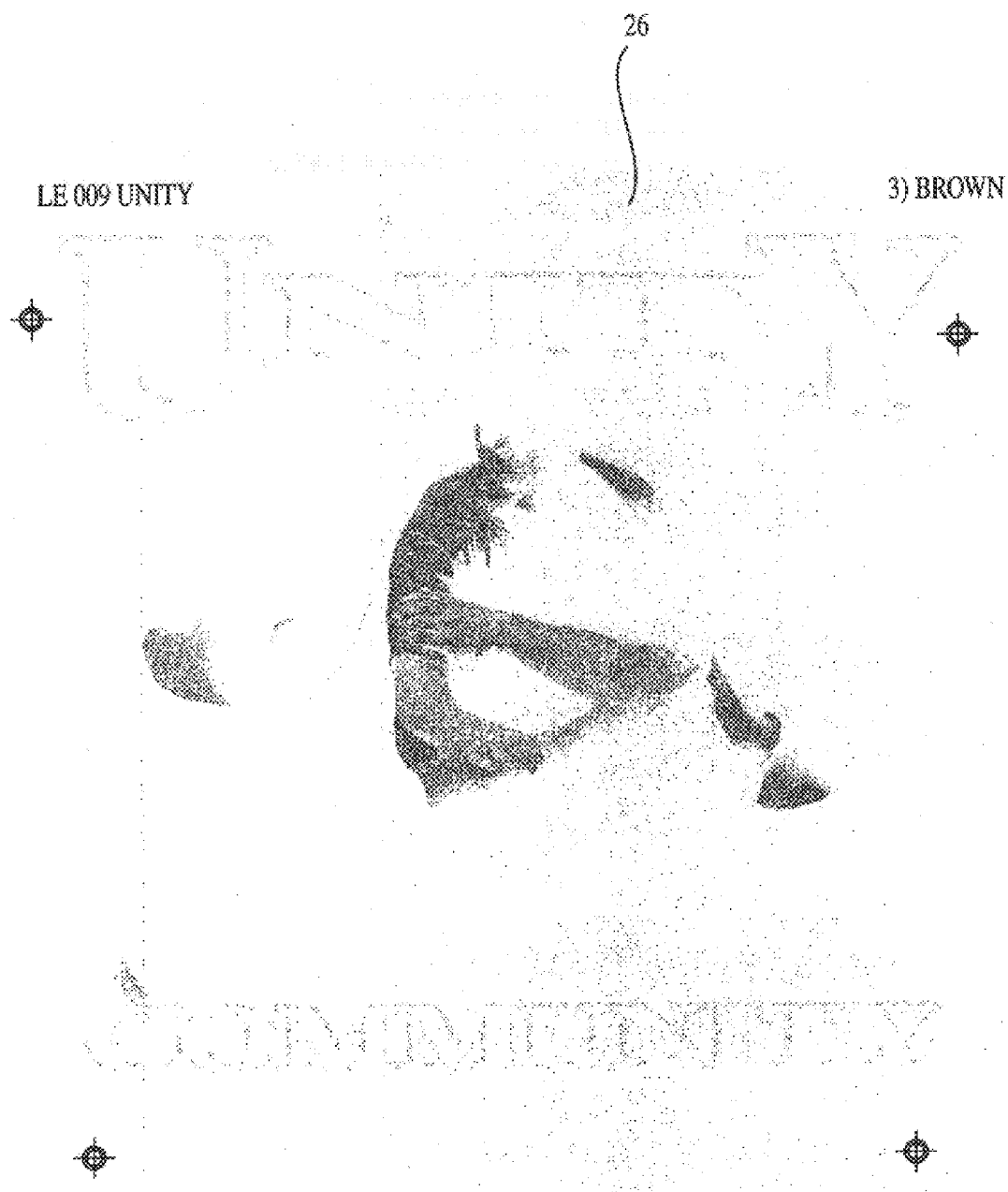
Figure 10:
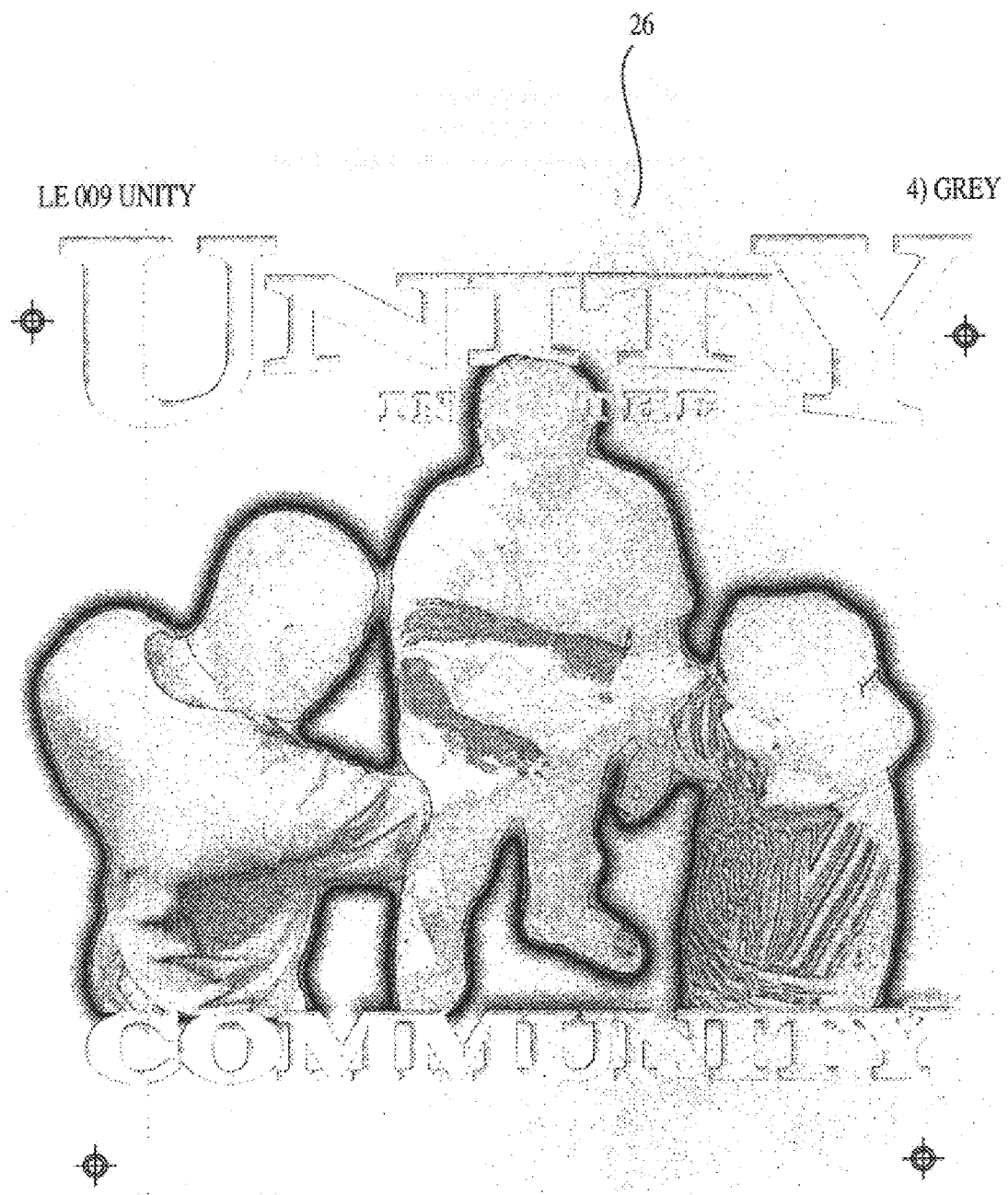
Figure 11:
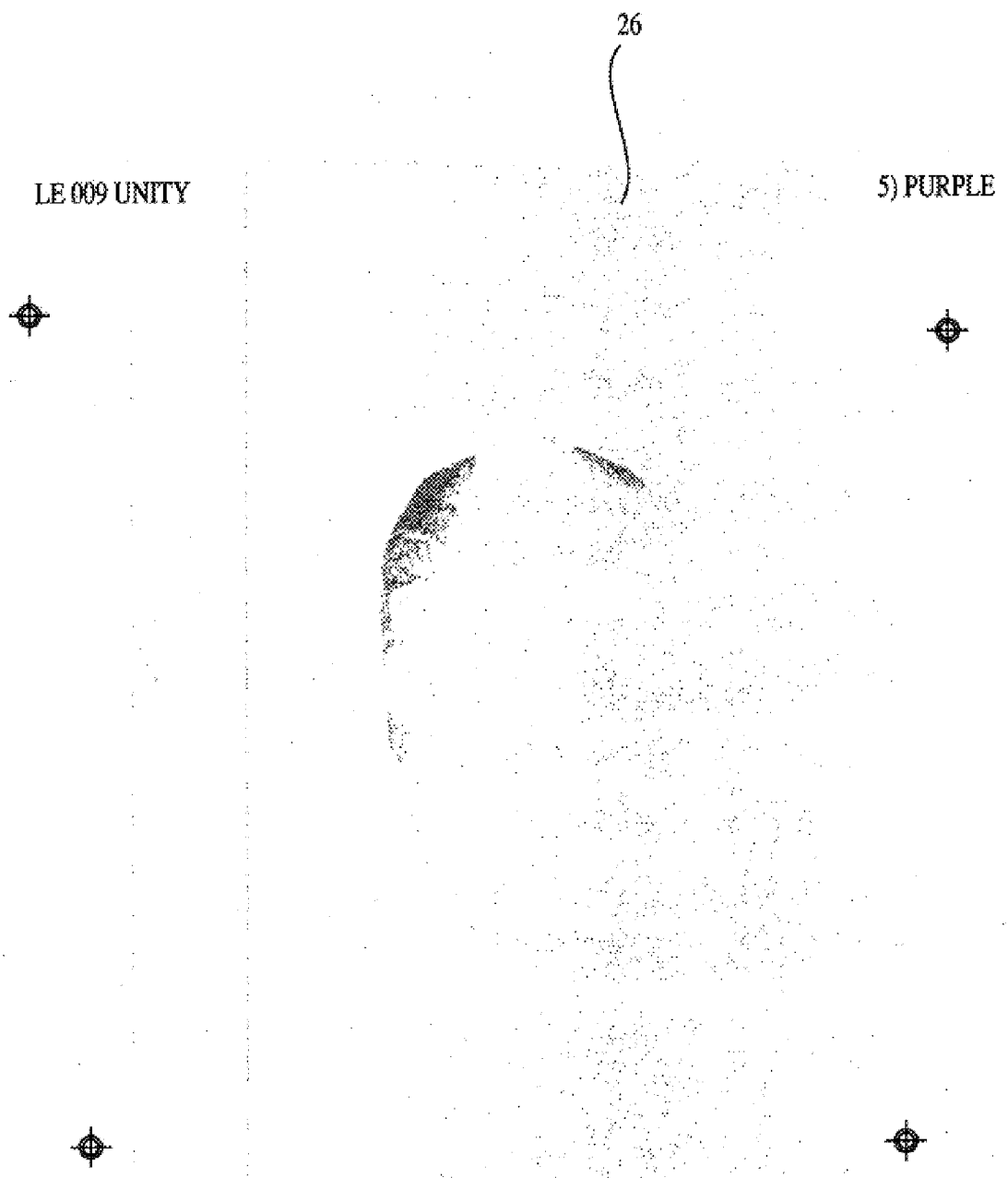
Figure 12:
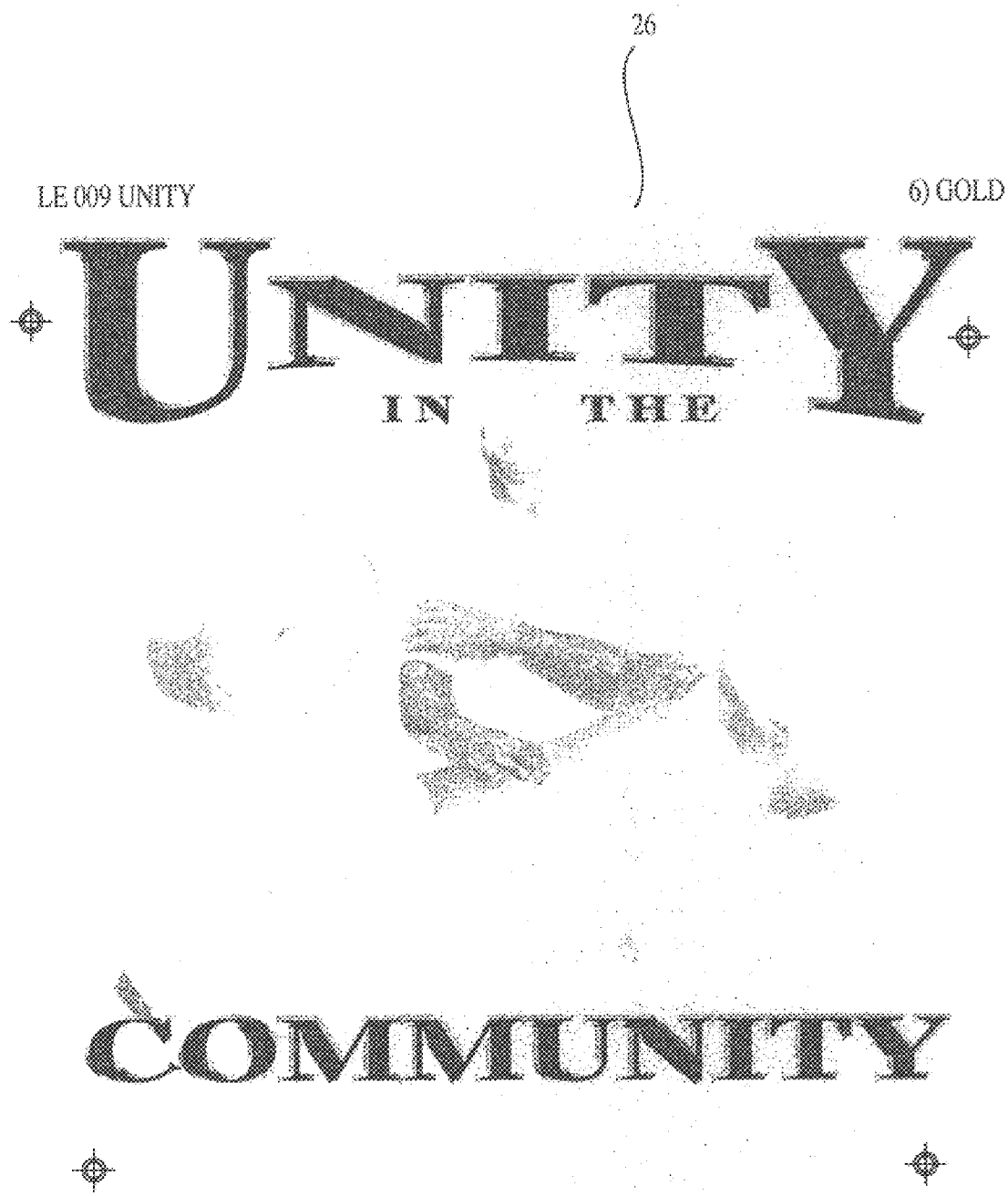
Figure 13:
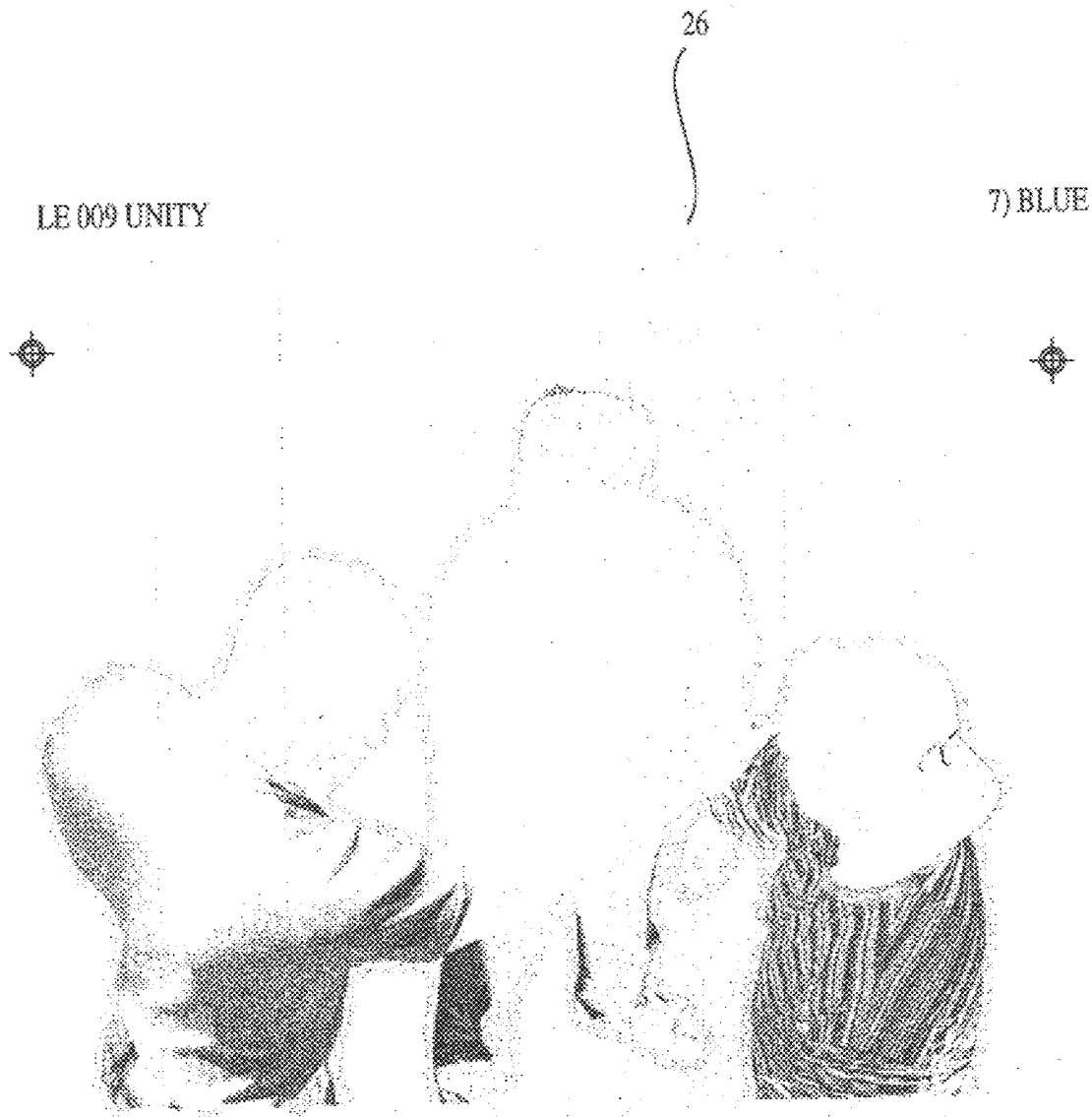
Figure 14:
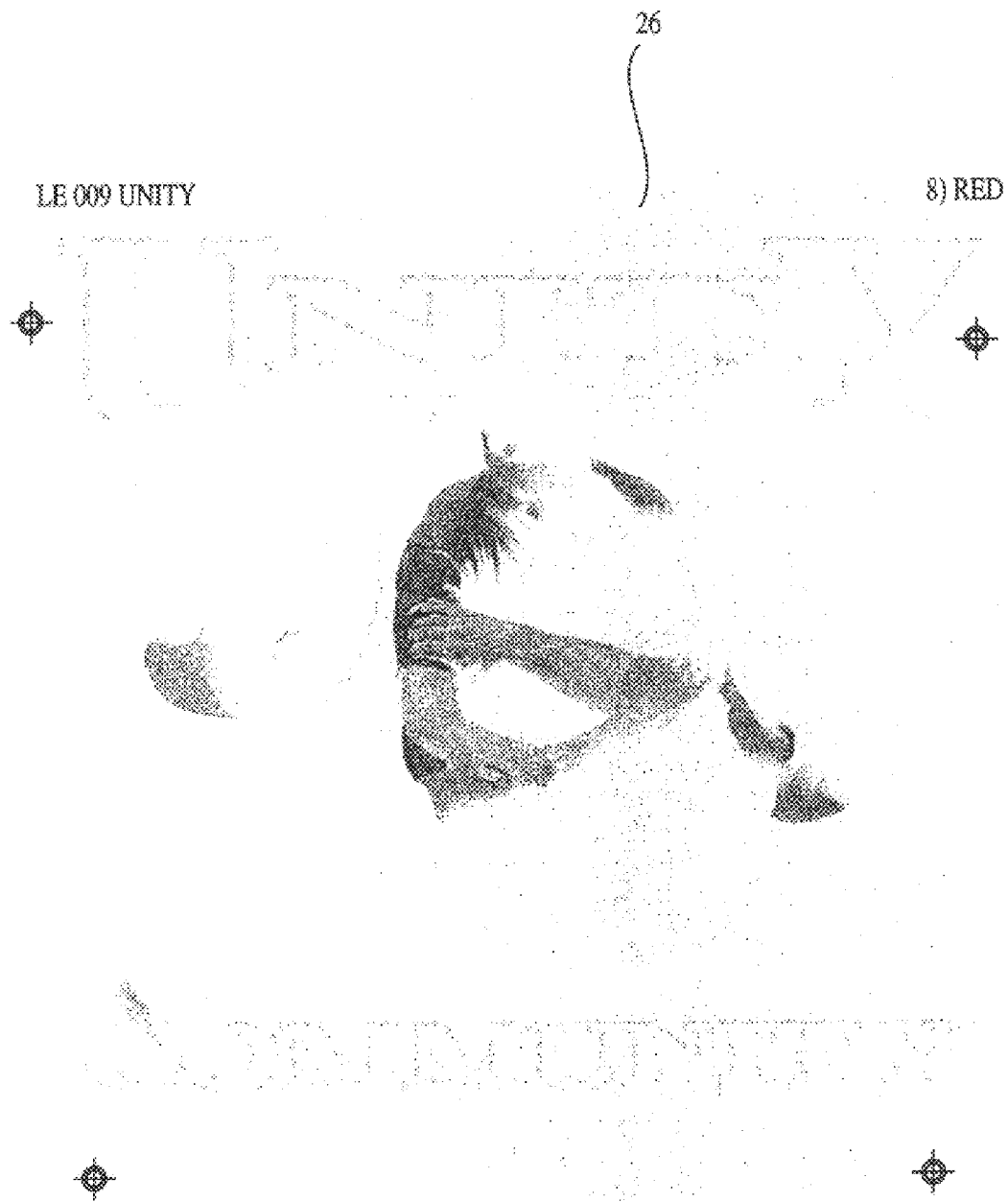
Figure 15:
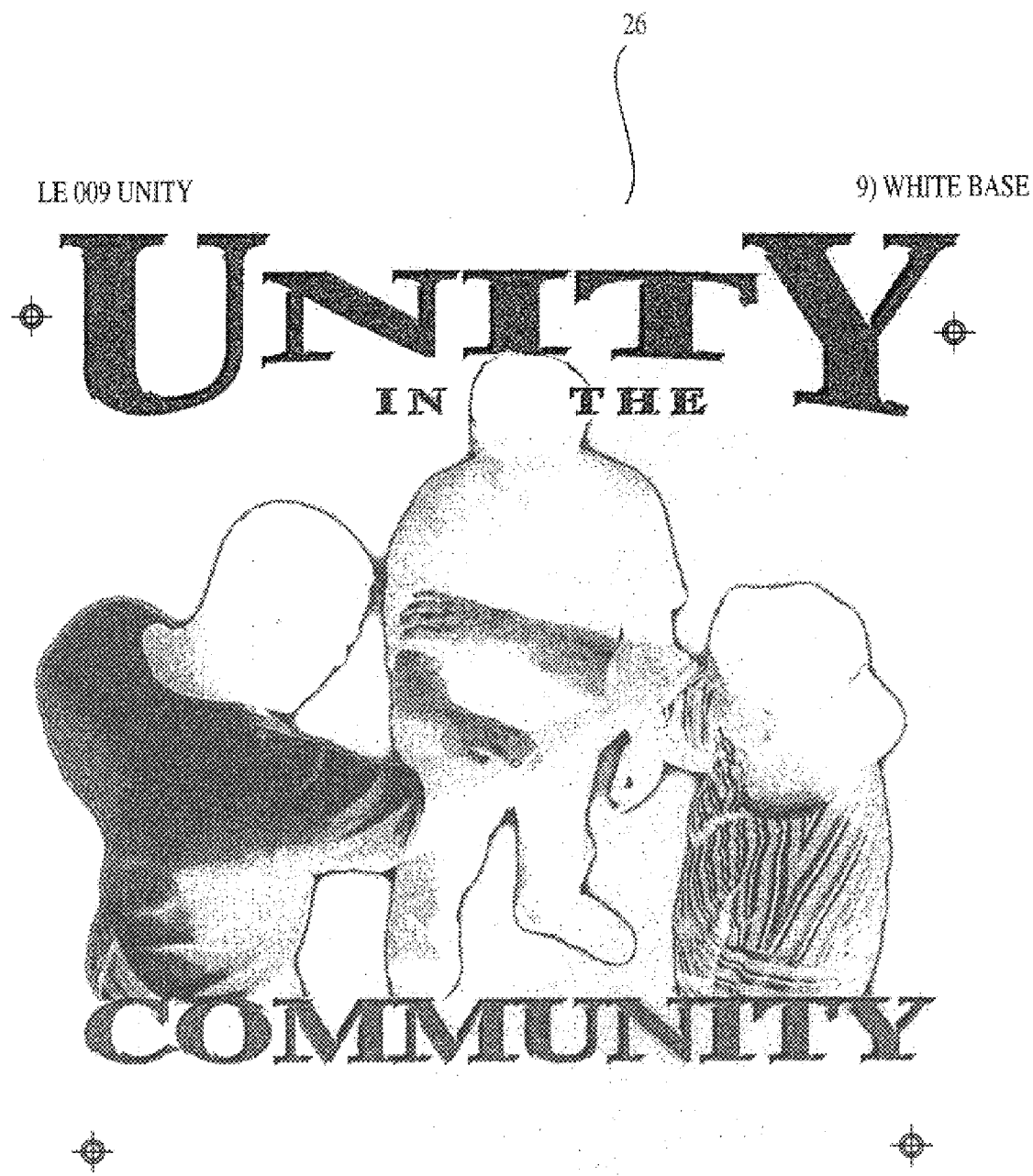

A color separation is then prepared to separate the image colors into component ink colors that, when combined, will yield a heat transfer image as close as possible to the altered scanned image. The ink colors are selected so the best and brightest colors are the exact colors that are printed based on the selection of inks, and not the colors that require a combination of inks, thereby producing the best overall results. Superior results are obtained with images that contain the colors white, blue, red, gold, purple, green, turquoise, gray, black, and brown. FIG. 2 shows a color separation 26. Color separations 26 essentially are half-tone printouts (made up of dots, like a newspaper photo) on a transparent film 34. The image 14 is separated into colors by selecting the area of the image 14 in which the color exists or the color is used to make another color. The printouts have dots in regions where a particular color is to be applied to the transfer 10. A different half-tone film is made for each ink color to be applied to the transfer. The computer assigns a particular ink color within a given color family from an ink library based on the color palette and color densities using a standard direct printing software, such as a program called "Spot Process," which is produced by Freehand Graphics. As written, the software does not achieve a satisfactory result because of differences between direct printing and transfer manufacturing. Transfer inks must be applied in a different order than direct printing inks. Transfer ink layers also must be twice as thick as direct print ink layers because the ink layer is "split" when the transfer is applied. When the transfer is heated, a portion of the inks adheres to the surface and a portion remains on the transfer paper. The ink "split" also affects color blending and shading. Knowledge about where in the ink layer this split will occur, which is a characteristic of the chosen inks, assists in obtaining finer gradations of color shading. Therefore, the standard software has been modified to alter the number and sequence of process steps to achieve satisfactory transfers. Specifically, the colors have been modified from being translucent to preferably 100% opaque and a white base is used to allow application of the transfer to a substrate of any color and to achieve desired resolution. Also, the print rotation has been reversed to reflect the fact that a transfer is a negative image rather than a positive image. FIG. 6 shows an image 14 and FIGS. 7–15 show color separations 26 of the image 14, where FIG. 7 is black, FIG. 8 is white, FIG. 9 is brown, FIG. 10 is gray, FIG. 11 is purple, FIG. 12 is gold, FIG. 13 is blue, FIG. 14 is red, and FIG. 15 is white base.

First, a "white base" is selected. This is the plate 30 that is printed to go behind all of the other colors to help make the design opaque and to help make lighter shades of other colors. The area is selected, and a plate or channel is printed of the selection. The result is a gray scaled plate of the selection that looks similar to a black and white photograph, as shown in FIG. 2.

Figure 3:
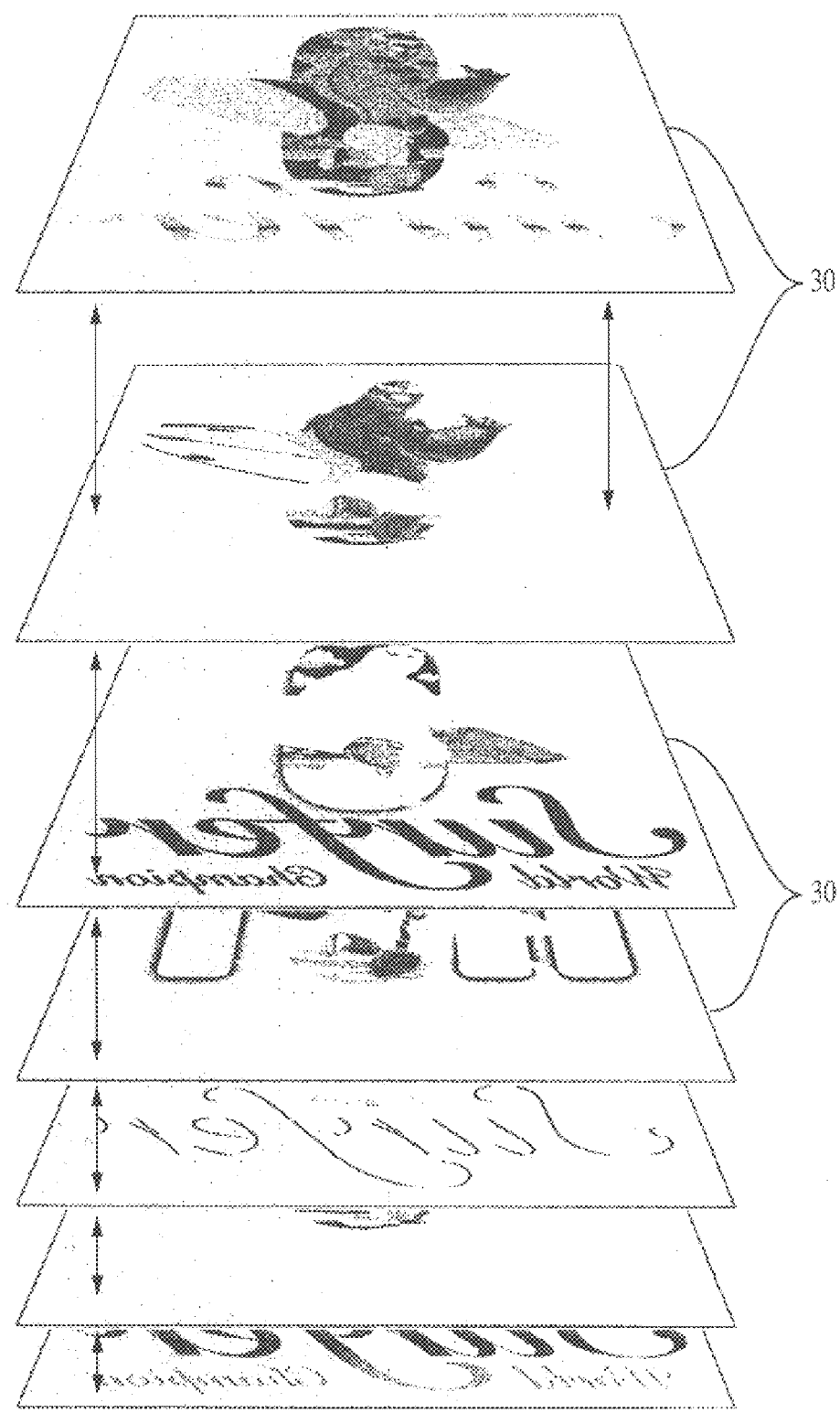
FIG. 3 shows an exploded view of an overlay of several color separation plates.

For the second step, red is selected. The area of the image that contains red or that needs red to create another color, such as pink, is selected. A plate 30 or channel is then created for the selection. The process continues for the remaining colors according to the printing order. As the plates are overlaid, as shown in FIG. 3, the illusion of more and different colors is created.

Figure 4:
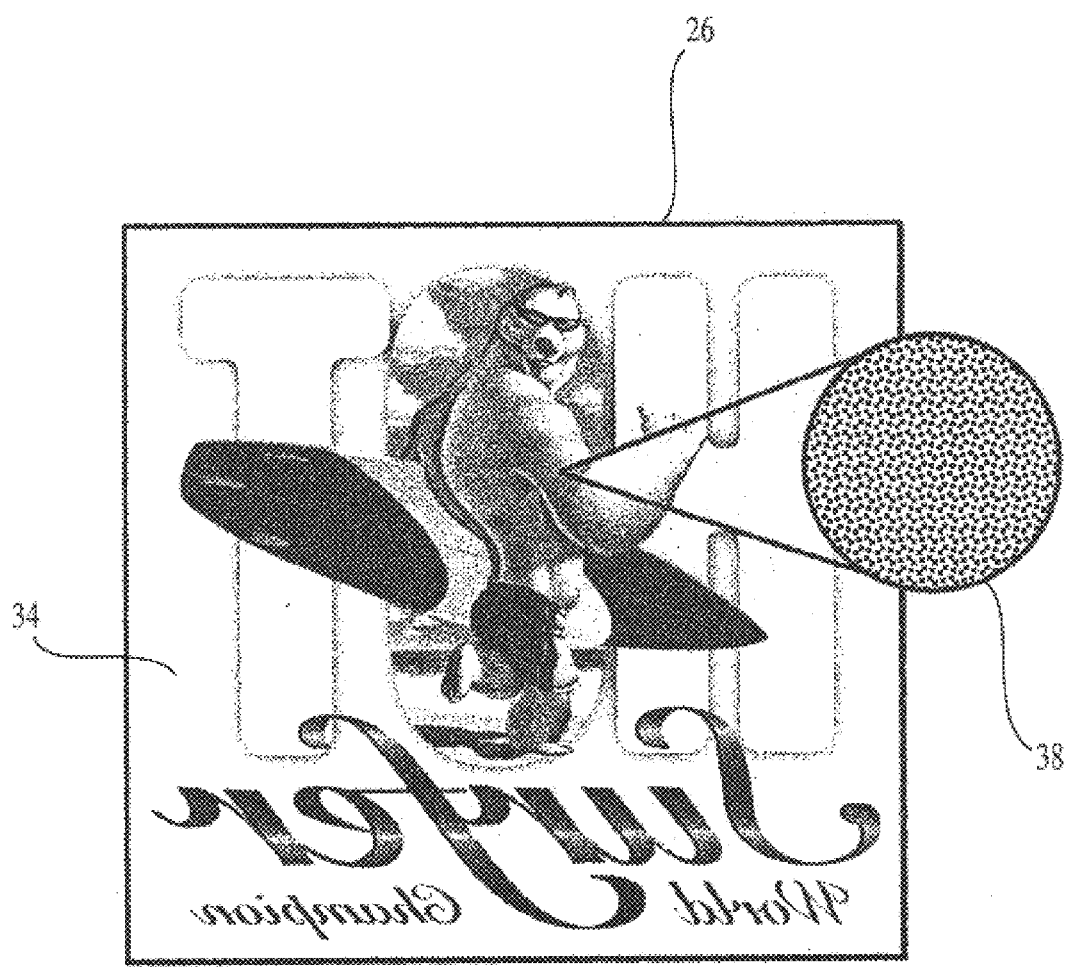
FIG. 4 shows a close-up view of a color separation printed on film.
Figure 5:
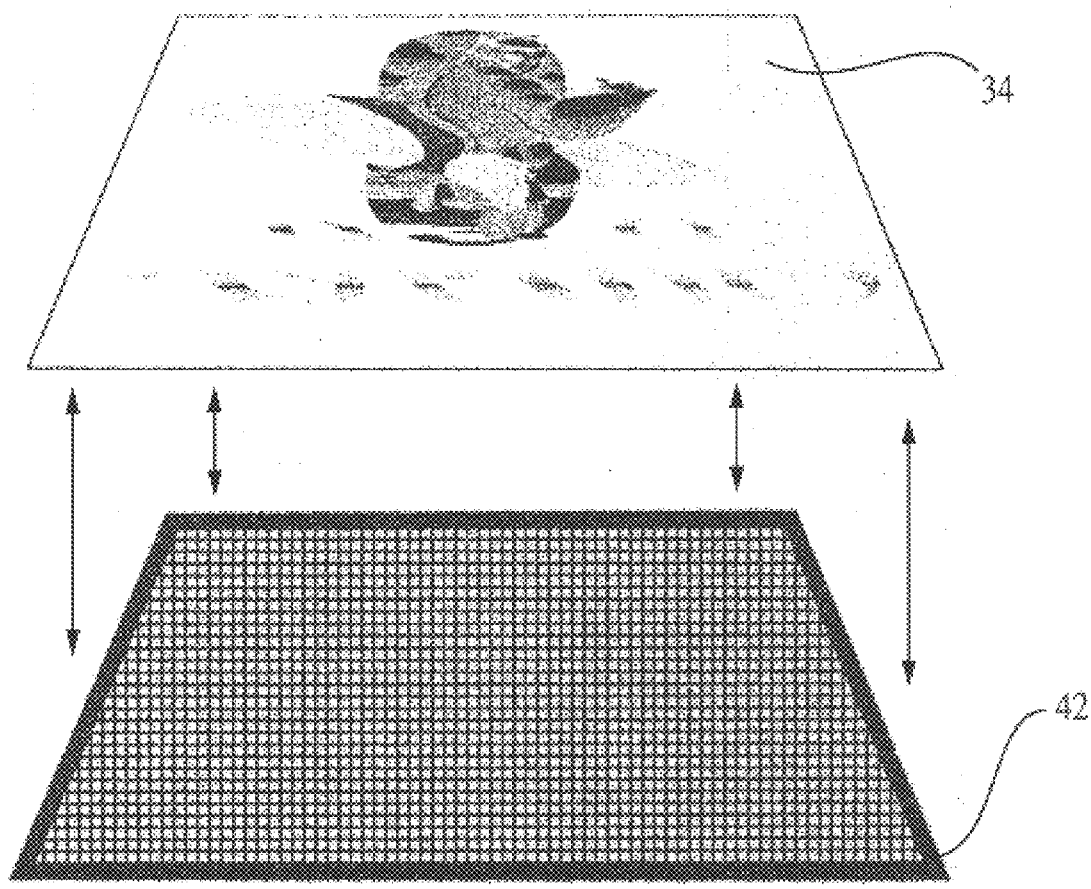
FIG. 5 shows a perspective exploded view of a mesh screen with a color separation film.

The order the colors are printed is opposite of what a viewer actually sees because a transfer 10 is a negative image. For the pre-press work, the order of printing is white base, red, blue, gold, purple, green, turquoise, gray, white, black, and brown. The first white base is for opacity and shading. The second white is for bright white in the image 14. Brown is only used when needed, such as in the creation of flesh tones or when brown is part of the image. After all of the plates are made 30, the image 14 is viewed with the plates 30 together so that they cover completely and produce a multi-colored, opaque image 14. When the image is satisfactory, the plates are separated and printed on film 34. All printing is made of dots 38 which lay on top of each other or next to each other with half-tone inks. The printing of dots 38 for this method lay next to each other and are printed 45 lines per inch. A close-up view of a separation 26 printed on film 34 is shown in FIG. 4.

The color separation films 34 with half-tones are placed on a mesh screen 42 to which a light-sensitive photoemulsion has been applied. The mesh 42 typically is made of polyester, nylon, or a combination of these, with mesh 42 openings of a predetermined size. Generally, the finer the mesh 42, the finer the resolution and shading possible. The screen 42 is exposed to light, such as ultraviolet (UV) light, causing the photoemulsion to harden in the areas without half-tones. The emulsion remains soft in the areas under the half-tones because the light did not penetrate through the half-tones. The soft emulsion is removed by rinsing, leaving open mesh 42 areas through which ink 18 will be applied to the transfer paper 22. The hardened emulsion forms a seal over the mesh 42 perforations in other areas. A different screen 42 is prepared for each color to be applied. Stretching of the mesh 42 so that it exposes properly is important in obtaining good resolution.

The inks 18 are applied in a different order than a direct printer would apply ink. In the preferred embodiment, the order of application is: black, white hilight, brown, gray, turquoise, green, gold, purple, blue, red, and white. A direct printer generally requires additional ink layers (one black and one white) compared to a transfer manufacturer. It is possible to make a transfer 10 without using all of these colors, but use of all of these colors generally is necessary to make a realistic, photographic quality multi-color transfer image.

Conventional machinery is used to apply ink 18 to the transfer page through the screens 42 in a predetermined order to build up the desired number of ink layers. Registration (consistent alignment of the screens relative to the transfer paper on all runs) also is important in obtaining good resolution.

The paper 22 used in making the transfer 10 must provide stable retention of ink 18 on the paper 22 until the transfer 10 is applied and facilitate release of the ink 18 during application. If the paper 22 releases ink 18 too easily, the ink 18 can practically be moved on the transfer 10 by blowing on it, which would result in a blurred image 14. If the paper 22 does not release ink 18 easily, it will be difficult to cleanly transfer the image 14 from the paper 22 to a substrate. The preferred paper is a total release paper that is treated with photopolymer silicone. In the preferred embodiment, the paper 22 allows the ink 18 to split with approximately 90–95% of the ink 18 being released from the paper 22 when heated in the traditional method. The increased release of ink 18 from the paper 22 over a non-treated paper, which releases about 50% of the ink, helps the released ink 18 to maintain a high level of opacity. The amount of ink 18 released from the paper 22 may vary depending on how even the ink 18 was originally applied and the evenness of the silicone coating on the paper 22. At this time, any brands of plastisol inks 18 may be used with the present invention. The transfer ink 18 typically comprises a resin, polyvinyl chloride, and a coloring agent. Consistent ink properties are important in achieving acceptable results.

The completed transfer may be heat applied to clothing or other items using conventional transfer presses. Satisfactory results may be obtained using a press temperature of about 375–395° F., a platen pressure of about 45–60 psi, and a dwell time of about 4–15 seconds. The ink 18 must have a shear rate sufficient to provide the necessary opacity and acceptable ink split. The ink 18 also must have a viscosity that allows printing the desired number of lines per inch.

The preferred embodiments have been described above. Those skilled in the art will note that the above method and apparatus may incorporate changes and modifications without departing from the general scope of this invention. It is intended to include all such modifications and alterations in so far as they come within the scope of the appended claims or the equivalents thereof.

We claim:

1. method of making a heat transfer from an image, comprising the steps of:
   scanning an image to create a computer image represented by a computer readable image file;
   separating said computer image into a plurality of colors using a computer to create a separated image;
   creating a plurality of plates from said separated image, each of said plurality of plates corresponding to one of said plurality of colors;
   printing each of said plurality of plates on film to create a plurality of color separation films, said color separation films having printed matter corresponding to one of said plurality of colors;
   treating a plurality of mesh screens with a photoemulsion;
   placing said plurality of color separation films on said plurality of mesh screens;
   applying light to said mesh screens, a portion of said photoemulsion hardening in said light and a second portion of said photemulsion covered by said printed matter on said color separation films remaining soft;
   washing said plurality of mesh screens to remove said second portion of said photoemulsion; and,
   applying a plurality of colored inks to a piece of transfer paper through said plurality of mesh screens, each of said plurality of colored inks corresponding to one of said color separations and one of said plurality of mesh screens.

2. The method of claim 1 wherein the step of scanning said image to create a computer image represented by a computer readable image file further comprises the step of:
   correcting said computer readable image file using said computer so that said plurality of colors represented by said computer image are substantially the same as said plurality of colors of said image.

3. The method of claim 1 wherein the steps of separating the computer image into a plurality of colors using a computer to create a separated image and creating a plurality of plates from said separated image further comprise the steps of:
   selecting a portion of said computer image requiring a white base;
   creating a plate of said white base;
   selecting a color portion of said computer image requiring a color from a group comprising red, blue, gold, purple, green, turquoise, gray, while, and black;
   creating a plate of said color portion;
   selecting additional color portions of said computer image from said group comprising red, blue, gold, purple, green, turquoise, gray, white, and black; and,
   creating additional plates of said additional color portions.

4. The method of claim 3 wherein further comprising the steps of:
   selecting a brown portion of said computer image requiring a brown color;
   creating a plate of said brown portion.

5. The method of claim 1, after the step of creating a plurality of plates from said separated image, further comprising the step of:
   viewing said plurality of plates together.

6. The method of claim 5 further comprising the step of:
   adjusting at least one of said plurality of plates to create an opaque image.

7. The method of claim 1 wherein said step of printing each of said plurality of plates on film to create a plurality of color separation films comprises the step of:
   printing a plurality of dots on said film.

8. The method of claim 7 wherein said dots are printed on top of each other.

9. The method of clam 7 wherein said dots are printed next to each other.

10. The method of claim 9 wherein said dots are printed 45 lines per inch.

11. A heat transfer of an image produced by a method comprising the steps of:
    scanning an image to create a computer image represented by a computer readable image file;
    separating said computer image into a plurality of colors using a computer to create a separated image;
    creating a plurality of plates from said separated image, each of said plurality of plates corresponding to one of said plurality of colors;
    printing each of said plurality of plates on film to create a plurality of color separation films, said color separation films having printed matter corresponding to one of said plurality of colors;
    treating a plurality of mesh screens with a photoemulsion;
    placing said plurality of color separation films on said plurality of mesh screens;
    applying light to said mesh screens, a portion of said photoemulsion hardening in said light and a second portion of said photemulsion covered by said printed matter on said color separation films remaining soft;
    washing said plurality of mesh screens to remove said second portion of said photoemulsion; and, applying a plurality of colored inks to a piece of transfer paper through said plurality of mesh screens, each of said plurality of colored inks corresponding to one of said color separations and one of said plurality of mesh screens.

12. The heat transfer of claim 11 wherein the step of scanning said image to create a computer image represented by a computer readable image file further comprises the step of:

correcting said computer readable image file using said computer so that said plurality of colors represented by said computer image are substantially the same as said plurality of colors of said image.

13. The heat transfer of claim 11 wherein the steps of separating the computer image into a plurality of colors using a computer to create a separated image and creating a plurality of plates from said separated image further comprise the steps of:

selecting a portion of said computer image requiring a white base;

creating a plate of said white base;

selecting a color portion of said computer image requiring a color from a group comprising red, blue, gold, purple, green, turquoise, gray, white, and black;

creating a plate of said color portion;

selecting additional color portions of said computer image from said group comprising red, blue, gold, purple, green, turquoise, gray, white, and black; and, creating additional plates of said additional color portions.

14. The heat transfer of claim 13 wherein further comprising the steps of:

selecting a brown portion of said computer image requiring a brown color;

creating a plate of said brown portion.

15. The heat transfer of claim 11, after the step of creating a plurality of plates from said separated image, further comprising the step of:

viewing said plurality of plates together.

16. The heat transfer of claim 15 further comprising the step of:

adjusting at least one of said plurality of plates to create an opaque image.

17. The heat transfer of claim 11 wherein said step of printing each of said plurality of plates on film to create a plurality of color separation films comprises the step of:

printing a plurality of dots on said film.

18. The heat transfer of claim 17 wherein said dots are printed on top of each other.

19. The heat transfer of clam 17 wherein said dots are printed next to each other.

20. The heat transfer of claim 19 wherein said dots are printed 45 lines per inch.

* * * * *